United States Patent [19]

Michihira et al.

[11] Patent Number: 5,283,712
[45] Date of Patent: Feb. 1, 1994

[54] INTEGRATED CIRCUIT FOR VEHICLE

[75] Inventors: Osamu Michihira, Hiroshima; Tomoji Izumi, Hatsukaichi; Nagahisa Fujita; Yuichi Itoh, both of Hiroshima; Masaaki Shimizu, Iwakuni; Seiji Hirano, Hiroshima, all of Japan

[73] Assignee: Mazda Motor Corporation, Hiroshima, Japan

[21] Appl. No.: 921,999

[22] Filed: Aug. 4, 1992

Related U.S. Application Data

[63] Continuation of Ser. No. 426,596, Oct. 25, 1989, abandoned.

[30] Foreign Application Priority Data

| Oct. 27, 1988 | [JP] | Japan | 63-269447 |
| Oct. 31, 1988 | [JP] | Japan | 63-273301 |
| Dec. 23, 1988 | [JP] | Japan | 63-323744 |
| Sep. 5, 1989 | [JP] | Japan | 1-228279 |

[51] Int. Cl.⁵ .................. H01R 23/70; H01R 9/09
[52] U.S. Cl. .......................... 361/785; 439/76; 361/744; 361/752; 361/796
[58] Field of Search ............. 361/390, 421, 392, 393, 361/394, 395, 396, 397, 398, 399, 408, 412, 413, 415; 174/254, 255; 439/76, 79, 81

[56] References Cited

U.S. PATENT DOCUMENTS

| 3,136,591 | 6/1964 | Just et al. | 439/79 |
| 3,599,046 | 8/1971 | Spreitzer | 361/413 |
| 3,971,127 | 7/1976 | Giguere et al. | 174/254 |
| 4,454,566 | 6/1984 | Coyne | 361/415 |
| 4,689,721 | 8/1987 | Damerow et al. | 361/398 |
| 4,723,196 | 2/1988 | Hofmeister et al. | 361/399 |
| 4,728,751 | 3/1988 | Canestaro et al. | 361/408 |
| 4,791,527 | 12/1988 | Brown | 361/395 |
| 4,858,071 | 8/1989 | Manake et al. | 361/386 |
| 5,000,690 | 3/1991 | Sonobe et al. | 361/395 |
| 5,013,250 | 5/1991 | Schulz | 361/395 |
| 5,040,994 | 8/1991 | Nakamoto et al. | 361/395 |
| 5,060,113 | 10/1991 | Jacobs | 361/413 |

FOREIGN PATENT DOCUMENTS

| G8430486.2 | 1/1984 | Fed. Rep. of Germany . |
| 3228398 | 2/1984 | Fed. Rep. of Germany . |
| 3345701 | 6/1985 | Fed. Rep. of Germany . |
| 0019680 | 12/1988 | Fed. Rep. of Germany . |
| 46-132234 | 4/1971 | Japan . |
| 63-16449 | 2/1988 | Japan . |
| 63-29947 | 2/1988 | Japan . |
| 63-131146 | 8/1988 | Japan . |
| 1-73798 | 3/1989 | Japan .................. 361/390 |
| 1-151294 | 6/1989 | Japan .................. 361/421 |

OTHER PUBLICATIONS

IBM Technical Disclosure Bulletin, "Porcelaimized Heat Sink Assembly" by Cole et al., vol. 24, No. 7A, Dec. 1981.

*Primary Examiner*—Leo P. Picard
*Assistant Examiner*—Donald A. Sparks

[57] ABSTRACT

An integrated circuit for a vehicle, vehicle which is formed in the shape of a case and which includes a pair of circuit boards, and a connector electrically connected to another connector. Each circuit board includes a metal circuit board main body, defining an outer portion of the case, an insulating layer formed on the entire inner surface of the circuit board main body, a conductive layer formed on the insulating layer in a predetermined circuit pattern, and a plurality of circuit elements electrically connected to a predetermined portion of the conductive layer. The connector includes a connector housing fixed to the circuit boards and having a recess for receiving the other connector, a plurality of through holes being formed in the connector housing, and a plurality of connector pins, one-end portions of which are connected to connecting terminals formed at an edge portion of the conductive layer, middle portions of which extend through the through holes formed in the connector housing, and the other-end portions of which project into the recess and are contactable with the other connector.

17 Claims, 11 Drawing Sheets

INTEGRATED CIRCUIT FOR VEHICLE

This application is a continuation of application Ser. No. 07/426,596, filed Oct. 25, 1989, now abandoned.

BACKGROUND OF THE INVENTION

The present invention relates to an integrated circuit for a vehicle, in which a conductive layer is formed on a conductive substrate through an insulating layer so as to fix circuit elements.

As a conventional integrated circuit (IC) in which a conductive foil is adhered to a conductive substrate through an insulating layer to fix circuit elements, a technique disclosed in Japanese Patent Publication No. 46-13234 is known. A method of manufacturing an IC disclosed in this prior art comprises the steps of: anodic-oxidizing at least one major surface of an aluminum substrate to form an aluminum oxide thin layer on the surface of the substrate; selectively depositing a resistive material layer and a conductive material layer on the aluminum oxide thin layer to form a plurality of circuit elements; fixing a transistor pellet onto a lead portion formed by selectively depositing the conductive material layer; and sealing at least all the circuit elements with an insulating resin.

In an IC formed in this manner, heat generated by a resistor, a transistor, or the like can be quickly and effectively dissipated, so that an output circuit, or the like can be formed as an IC.

The IC formed in this manner may be adopted for use in a vehicle in view of a compact structure and low cost. However, when such an IC is actually used in a vehicle, it must be reliably connected to other control portions of a vehicle while effectively utilizing its compact and low-cost advantages. If an existing connecting device is used, it is relatively large and is expensive. Thus, even if the IC itself is made compact and reduced in cost, its merit cannot be satisfactorily utilized.

Even if a connecting device is rendered compact, if it has a poor assembly property, it is often impossible to assemble the connecting device in practice. Therefore, the assembly property must be sufficiently taken into consideration.

SUMMARY OF THE INVENTION

The present invention has been made in consideration of the above situation, and has as its principal object to provide an integrated circuit for a vehicle, in which a conductive foil is adhered on a conductive substrate through an insulating layer to fix circuit elements, and which can be rendered compact and can reduce cost when it is used in a vehicle.

It is another object of the present invention to provide an integrated circuit for a vehicle which can be rendered compact, can reduce cost, and can provide a good assembly property.

It is still another object of the present invention to provide an integrated circuit for a vehicle, which can make compact an arrangement of a connecting box connected to the integrated circuit.

In order to achieve the principal object of the present invention, according to a first aspect of the present invention, an integrated circuit for a vehicle, comprises:
a pair of circuit boards, each circuit board including a metal circuit board main body; an insulating layer formed on an entire surface of the circuit board main body; a conductive layer formed on the insulating layer in a predetermined circuit pattern; and a plurality of circuit elements electrically connected to a predetermined portion of the conductive layer; and
externally connecting connector means electrically connected to another connector,
the externally connecting connector means including
a connector housing fixed to the circuit boards and having a recess for receiving the another connector, a plurality of through holes being formed in the connector housing; and
a plurality of connector pins, one-end portions of which are connected to connecting terminals formed at an edge portion of the conductive layer, middle portions of which extend through the holes formed in the connector housing, and the other-end portions of which project into the recess.

In order to achieve the principal object of the present invention, according to a second aspect of the present invention, an integrated circuit for a vehicle, comprises:
a pair of circuit boards, each circuit board including
a metal circuit board main body; an insulating layer formed on an entire surface of the circuit board main body; a conductive layer formed on the insulating layer in a predetermined circuit pattern; and a plurality of circuit elements electrically connected to a predetermined portion of the conductive layer; and
external connector means electrically connected to another connector,
wherein one functional component for a vehicle is constituted by an independent integrated circuit, and
the circuit board main body of the circuit board is defined as a functional component case.

In order to achieve the above-mentioned other object of the present invention, according to a third aspect of the present invention, a connector housing of an integrated circuit includes:
a pair of connector housing halves respectively fixed to the circuit boards before the circuit boards are assembled to oppose each other, and having a plurality of connector pins connected to the corresponding conductive layers; and
superposition means which are respectively formed on the connector housing halves and are superposed on each other so as to constitute one connector housing when the circuit boards are assembled to oppose each other.

In order to achieve the above-mentioned other object of the present invention, according to a fourth aspect of the present invention,
the connector housing of the integrated circuit is fixed in advance on one circuit board before the circuit boards are assembled to oppose each other,
the connector pins include first connector pins mounted in advance in the connector housing to be inserted thereto before the assembly, and second connector pins electrically and mechanically connected to connecting terminals formed at an edge portion of the conductive layer of the other circuit board, and
the externally connecting connector means further includes a mounting portion which is formed on the connector housing and to which the second connector pins are mounted when the circuit boards are assembled to oppose each other.

In order to achieve the above-mentioned still other object of the present invention, according to a fifth aspect of the present invention, an integrated circuit for a vehicle comprises:

- a pair of circuit boards, each circuit board including
  - a metal circuit board main body; an insulating layer formed on an entire surface of the circuit board main body; a conductive layer formed on the insulating layer in a predetermined circuit pattern; and a plurality of circuit elements electrically connected to a predetermined portion of the conductive layer; and
- externally connecting connector means electrically connected to another connector,
- wherein a plurality of the integrated circuits are formed to have independent control functions, and further including
- a connecting box to which the plurality of integrated circuits are simultaneously mounted through the corresponding externally connecting connector means to be electrically connected thereto; and
- multiplex transmission means, arranged in the connecting box, for connecting the plurality of integrated circuits and portions to be controlled through multiplex transmission.

Other features and advantages of the present invention will be apparent from the following description taken in conjunction with the accompanying drawings, in which like reference characters designate the same or similar parts throughout the figures thereof.

DETAILED DESCRIPTION OF THE PREFERRED EMBODIMENTS

An arrangement of the first embodiment of an integrated circuit (IC) for a vehicle according to the present invention will be described in detail below with reference to the accompanying drawings.

Figure 1:
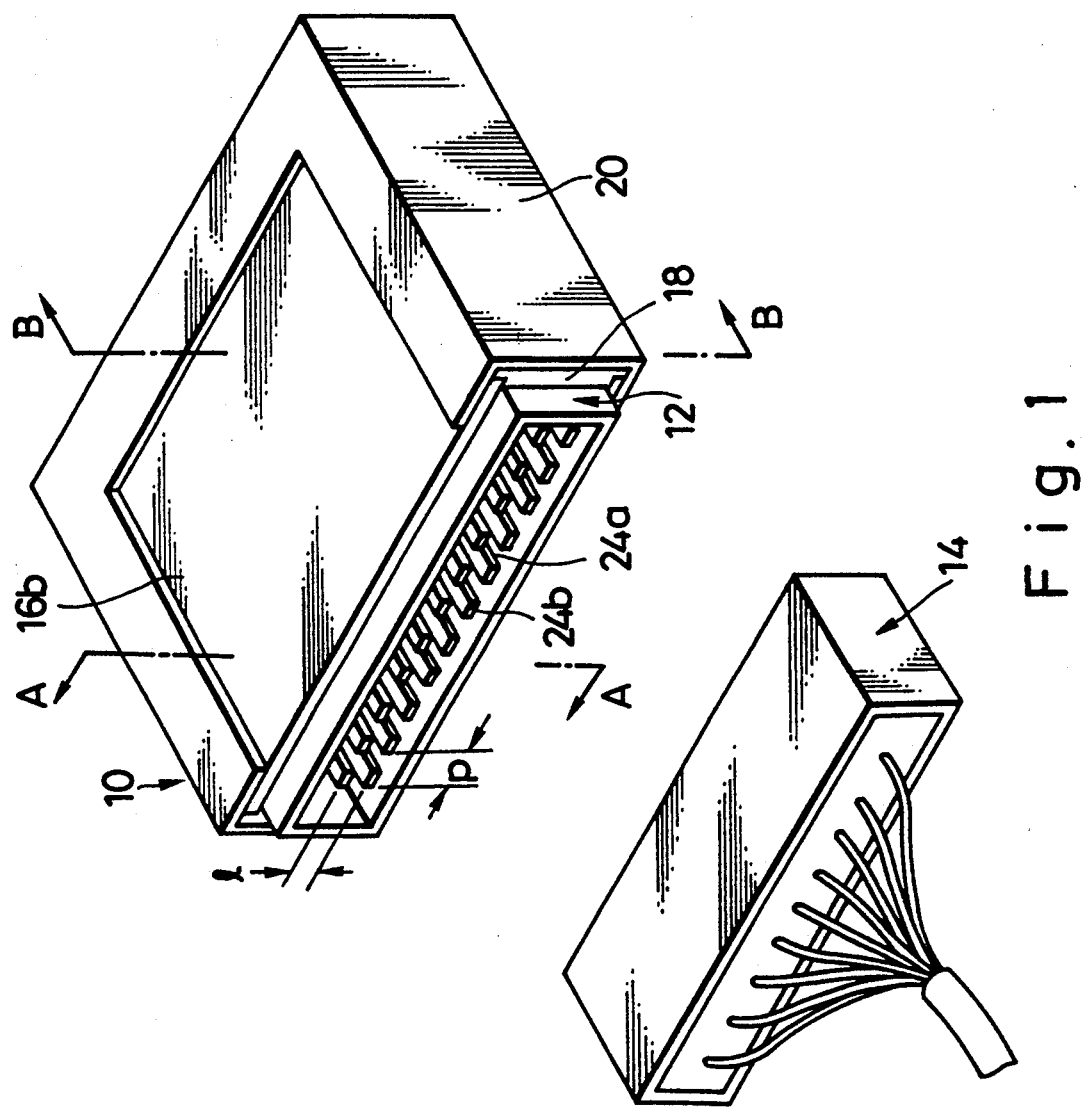
FIG. 1 is a perspective view showing an arrangement of the first embodiment of an integrated circuit for a vehicle according to the present invention.

FIG. 1 shows an IC 10 for a vehicle according to the present invention. The IC 10 is arranged as an independent functional component for a vehicle. More specifically, the IC 10 is arranged as an IC independently having a function as an engine control unit.

As shown in FIG. 1, the IC 10 is formed as a closed box-like case. A female connector 12 as a connecting device is integrally attached to one end portion of the IC 10. The female connector 12 is connected to a conventional female connector 14 as will be described in detail later.

Figure 2:
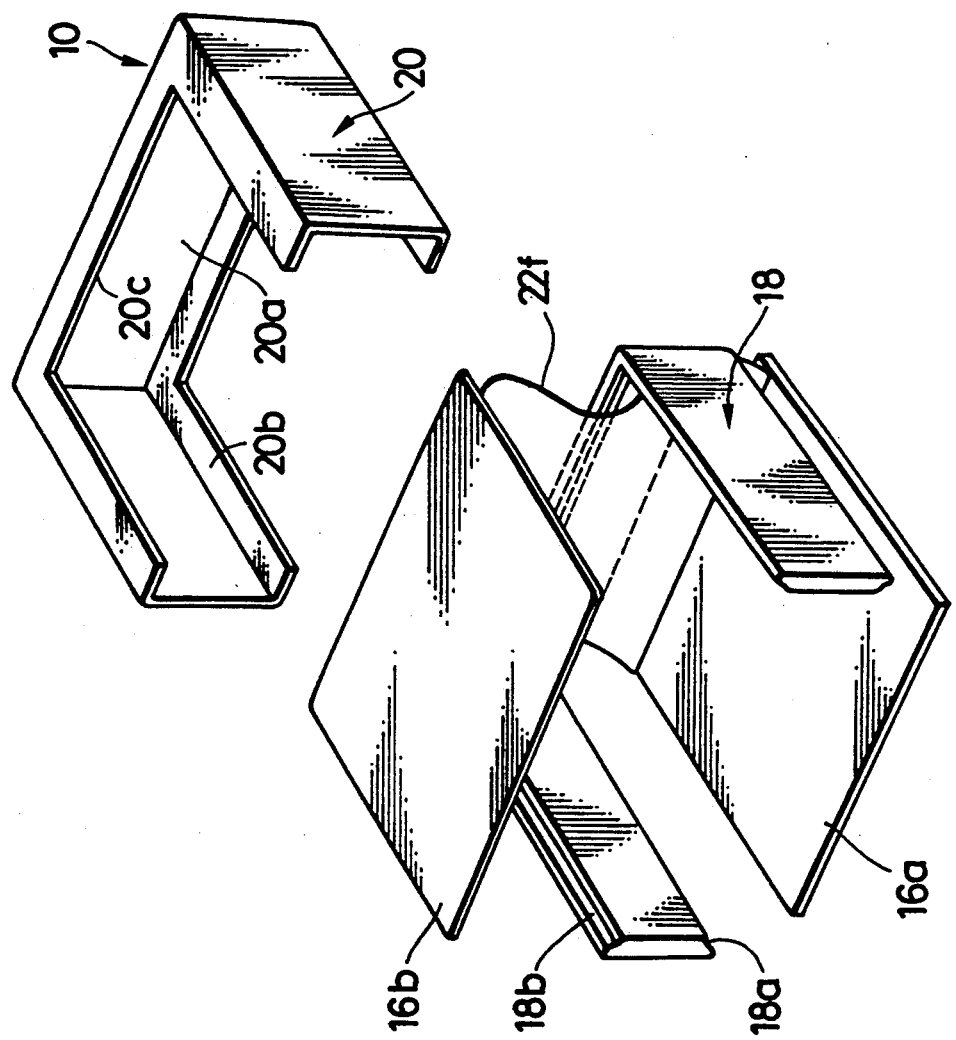
FIG. 2 is an exploded perspective view showing an arrangement of the integrated circuit shown in FIG. 1.
Figure 3A:
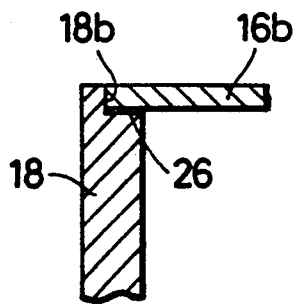
FIG. 3A is a sectional view taken along a line A—A in FIG. 1.
Figure 3B:
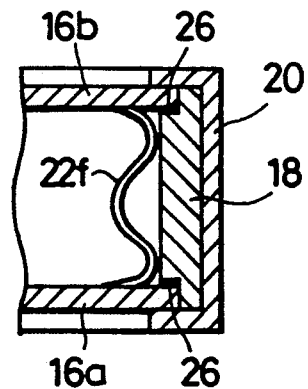
FIG. 3B is a sectional view taken along a line B—B in FIG. 1.

As shown in FIGS. 2 through 3B, the IC 10 comprises a pair of lower and upper circuit boards 16a and 16b which are separated from each other, a side plate 18 for vertically separating the circuit boards 16a and 16b by a predetermined interval and closing side surfaces, and a frame 20 for integrally fixing the circuit boards 16a and 16b and the side plate 18.

Figure 4A:
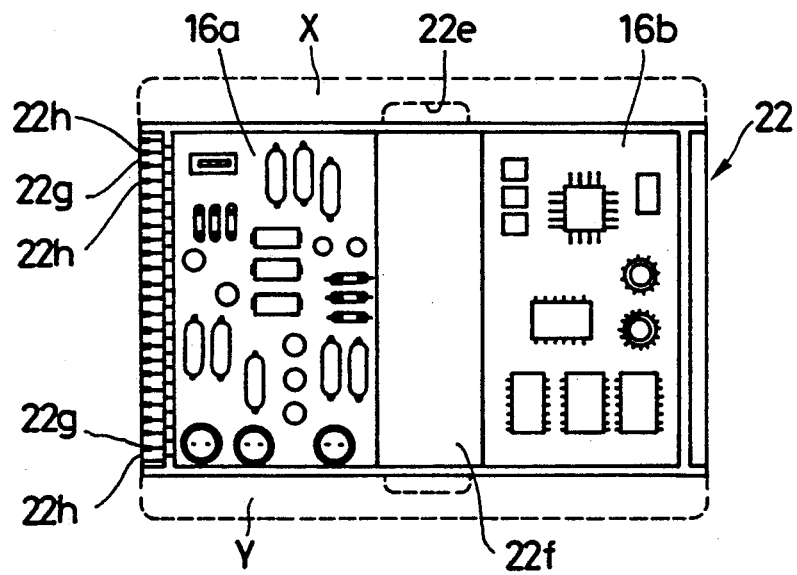
FIG. 4A is a plan view showing an arrangement of a common circuit board.
Figure 4B:
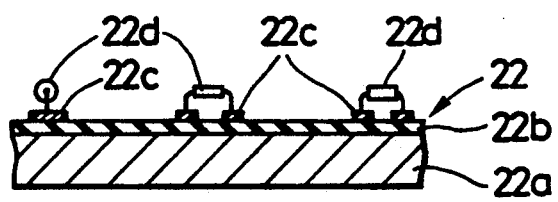
FIG. 4B is a sectional view showing an arrangement of the common circuit board.

More specifically, circuit elements such as an IC chip necessary for providing a function as an engine control unit arranged as an independent functional component for a vehicle, resistors, capacitors, and the like are mounted on the circuit boards 16a and 16b. As shown in FIG. 4A, the circuit boards 16a and 16b are formed by splitting one common circuit board 22 into two boards. More specifically, as shown in FIG. 4B, the common circuit board 22 is formed by a circuit board body 22a formed of a conductive material, e.g., aluminum, an insulating layer 22b adhered over the entire upper surface of the circuit board body 22a, a conductive foil 22c formed on the insulating layer 22b to have a predetermined circuit pattern and to define a circuit network, and a large number of circuit elements 22d electrically connected to predetermined portions of the conductive foil 22c.

As shown in FIG. 4A, a vertical opening 22e is preformed in the central portion of the common circuit board 22. Right and left circuit network portions to have the opening 22e as a boundary are connected to each other through a flexible circuit board 22f extending over the opening 22e. Upper and lower edges (regions indicated by reference symbols X and Y) including upper and lower ends of the opening 22e are cut off, so that the pair of circuit boards 16a and 16b are formed while being connected through the flexible circuit board 22f.

A plurality of connecting terminals 22g and 22h (which are arranged so that their polarities are inverted for every other terminal) are linearly formed along an edge portion on the upper surface of the outer edge portion of the circuit board 16a to be located at a lower position (the left circuit board in FIG. 4A), i.e., on an inner surface of an edge portion defining one end of the case in a state wherein the circuit boards are vertically separated from each other. Connecting pins 24a and 24b of the female connector 12 (to be described later) are fixed to and electrically connected to these connecting terminals 22g and 22h to extend outwardly.

The side plate 18 is formed to have a U-shape with one open side when viewed from the above, and is set so that the open side portion serves as one end of the case. Stepped portions 18a and 18b for receiving three edge portions of the corresponding circuit boards 16a and 16b are formed on the inner side edges of the lower and upper end faces of the side plate 18.

As shown in FIG. 3A, the circuit boards 16a and 16b are fitted in the corresponding stepped portions 18a and 18b rubber seals 26. Upon insertion of the rubber seals 26, entrance of dust into the case from gaps between these components can be prevented.

As shown in FIG. 2, the frame is formed to vertically clamp and surround the side surfaces closed by the side plate 18. The frame 20 comprises and is formed integrally with a main body 20a facing the side plate 18, and flange portions 20b and 20c extending inwardly by a predetermined distance (that is, a distance long enough to clamp three closed side edges of the lower and upper circuit boards 16a and 16b).

As shown in FIG. 3B, the frame 20 is formed to vertically clamp the lower and upper circuit boards 16a and 16b fitted in the lower and upper stepped portions of the side plate 18, thus integrally constituting the case. As shown in FIG. 3B, the flexible circuit board 22f for connecting the circuit elements 22d of the lower and upper circuit boards 16a and 16b is set to be located inside from the other end portion of the side plate 18.

Since the frame 20 is formed in this manner, the circuit boards 16a and 16b can be kept assembled to be vertically separated by the predetermined distance in a state wherein the side plate 18 is interposed therebetween.

More specifically, in the first embodiment, the IC 10 is formed into a case shape, and the lower and upper surfaces of the case are directly defined by the circuit boards 16a and 16b. As a result, the IC 10 can be rendered compact and lightweight as compared to a case wherein the circuit boards 16a and 16b are housed in separate cases.

Figure 5:
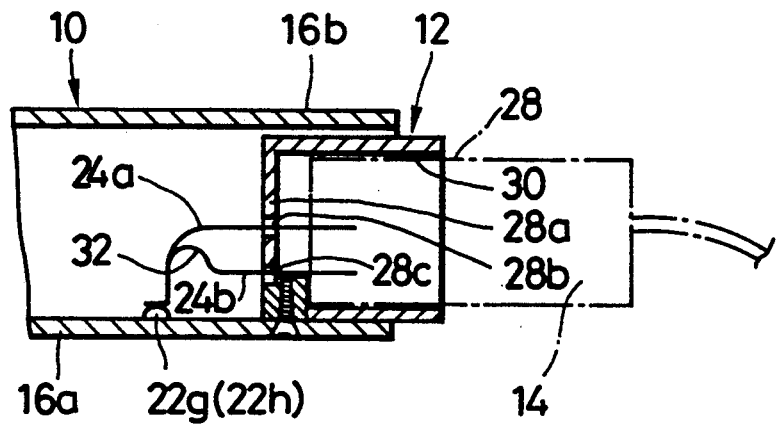
FIG. 5 is a sectional view showing an arrangement of a male connector attached to the integrated circuit.

The structure of a connecting device for connecting the case-like IC 10 with the above arrangement to be connected to a portion to a vehicle will be described below with reference to FIG. 5.

The connecting device comprises the female connector 12 attached to a one-end opening portion of the case-like IC 10 in a so-called internal mounting state, and the male connector 14 detachably connected to the female connector 12. The female connector 12 comprises a connector main body 28 formed into a box-like housing with one open side surface. The connector main body 28 is designed to be just fitted in the one-end opening portion of the case-like IC 10. In the fitting state, the connector main body 28 is fixed to the IC 10 by screws or the like.

The connector main body 28 has a recess 30 for receiving the male connector 14 in its side surface at one end side. The connector main body 28 has an upright segment 28a for just closing the one-end opening portion of the case-like IC 10 on its side surface at the other end side. A plurality of pairs of through holes 28b and 28c which are vertically separated from each other are formed in the upright segment 28a to be aligned along a lateral direction. For this reason, the connecting pins 24a connected to every other connecting terminals 22g of the connecting terminals 22g and 22h extend through the upper through holes 28b, and the connecting pins 24b connected to the remaining connecting terminals 22h extend through the lower through holes 28c while being deviated sideways.

Note that the length of each connecting pin 24b extending through the lower through hole 28c becomes smaller than that of the connecting pin 24a extending through the upper through hole 28b. In order to provide a length large enough to dissipate heat upon soldering of the connecting pins 24b to the connecting terminals 22h, a so-called arch portion 32 having a round middle portion is formed. With the arch portion 32, the length of each connecting pin 24b extending through the lower through hole 28c is set to be substantially the same as that of the connecting pin 24a extending through the upper through hole 28b, and these pins exhibit the same heat dissipation effect.

When the arch portion 32 is formed in the connecting pin 24b extending through the lower through hole 28c, and it serves as a shock absorber, a shock upon connection of the connectors can be sufficiently absorbed as well as the above-mentioned heat dissipation effect, and the connecting pins 24b can be prevented from being disengaged from the corresponding connecting terminals 22g.

In the first embodiment, a vertical distance l between these connecting pins 24a and 24b and a pitch p of horizontally adjacent pins are determined based on conventional pin arrangement specifications. As a result, a pair of male connectors 14 connected to the male connector 12 can be of a conventional type, thus providing an economical advantage.

Since a conventional female connector is heavy in weight and large in size, it is not employed, and an exclusive female connector 12 is formed in correspondence with the compact and lightweight case-like IC 10. Therefore, according to the first embodiment, the compact and lightweight structure of the IC 10 can be prevented from being impaired.

As described above, the IC 10 of the first embodiment is arranged to define lower and upper surfaces by the pair of circuit boards 16a and 16b. As a result, according to the first embodiment, the number of parts of the IC 10 can be reduced, thus achieving a compact and low-cost IC.

In the first embodiment, each of the circuit boards 16a and 16b is formed to have the aluminum conductive circuit board body 22a, the insulating layer 22b adhered on the circuit board body 22a, and the conductive foil 22c adhered on the insulating layer 22b to have a predetermined pattern. As a result, since heat generated by the various circuit elements 22d can be dissipated by utilizing the aluminum circuit board body 22a as a heat dissipation plate, a separate heat dissipation member need not be arranged, thus greatly making the structure compact.

In the first embodiment, as described above, since the lower and upper surfaces of the case are respectively defined by the pair of circuit boards 16a and 16b having the aluminum circuit board body 22a, these circuit boards 16a and 16b can be utilized as electromagnetic shield members. As a result, an internal space of the case-like IC 10 can be substantially electromagnetically shielded, and the circuit elements 22d are not easily influenced by an electromagnetic wave.

The present invention is not limited to the arrangement of the first embodiment, and various changes and modifications may be made within the spirit and scope of the invention.

Various embodiments and modifications of the present invention will be described below. In the modifications and other embodiments, the same reference numerals denote the same parts as in the arrangement of the first embodiment, and a detailed description thereof will be omitted.

For example, in the description of the first embodiment, the IC 10 serves as the engine control unit. However, the present invention is not limited to this. For example, the IC 10 may be arranged to be operated as independent functional components for a vehicle, such as an automatic-speed controller, a four-wheel steering controller, an automatic transmission controller, and the like.

Figure 6:
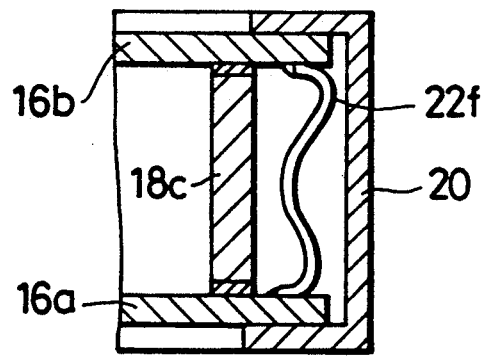
FIG. 6 is a sectional view showing an arrangement of a modification of the integrated circuit of the first embodiment.

In the first embodiment, as shown in FIG. 3B, the flexible circuit board 22f is located in a space surrounded by the side plate 18. However, the present invention is not limited to this. As shown in FIG. 6 showing one modification of the first embodiment, a surface is displaced forward (toward the opening) by a predetermined distance from the rear ends of the circuit boards 16a and 16b, so that the flexible circuit board 22f may extend between the segment 18c and the frame 20.

Figure 7:
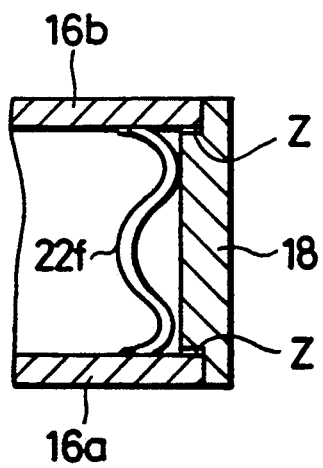
FIG. 7 is a sectional view showing an arrangement of another modification of the integrated circuit of the first embodiment.

In the first embodiment, the lower and upper circuit boards 16a and 16b are fitted in the lower and upper stepped portions 18a and 18b of the side plate 18, and this assembly is surrounded by the frame 20 from the outer side to integrally form the case-like IC 10. However, the present invention is not limited to this. For example, as shown in FIG. 7 showing another modification of the first embodiment, the lower and upper circuit boards 16a and 16b are fitted in the lower and upper stepped portions 18a and 18b of the side plate 18, and their contact surfaces are adhered to each other by an adhesive Z, thus integrally constituting the case-like IC 10 without using the frame 20.

The connecting terminals 22g and 22h are alternately and laterally aligned at the opening edge of the lower circuit board 16a in the first embodiment described above. However, the present invention is not limited to this. The connecting terminals may be arranged as shown in FIG. 8 showing the second embodiment.

Figure 8:
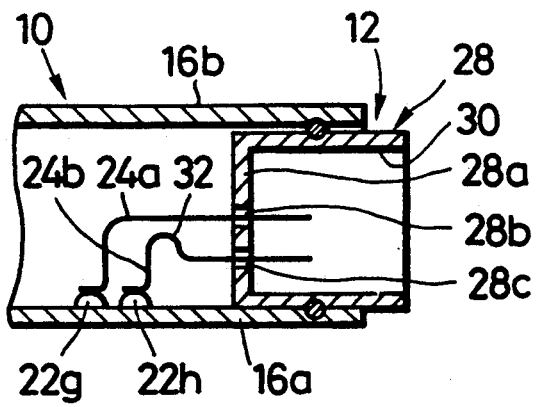
FIG. 8 is a sectional view showing an arrangement of the second embodiment of an integrated circuit according to the present invention.

In the second embodiment shown in FIG. 8, i.e., rear and front arrays at the opening edge of a lower circuit board 16a. The rear connecting terminals 22g (farther side from the female connector 12) are aligned to define an array different from that defined by the front connecting terminals 22h (nearer side to the female connector 12). Connecting pins 24a connected to the rear connecting terminals 22g extend through upper through holes 28b, and connecting pins 24b connected to the front connecting terminals 22h extend through lower through holes 28c.

Since the length of each connecting pin 24a connected to the front connecting terminal 22h becomes smaller than that of the connecting pin 24b connected to the rear connecting terminal 22g, an arch portion 32 is formed in a middle portion of the shorter connecting terminal 24b like in the first embodiment.

Since the second embodiment is arranged as described above, the same effect as in the first embodiment can be provided, and the number of connecting pins 24a and 24b can be increased.

In the second embodiment, two arrays of connecting terminals 22g and 22h are juxtaposed on the lower circuit board 16a. However, the present invention is not limited to this. For example, the connecting terminals may be arranged as shown in FIG. 9 showing one modification of the second embodiment.

Figure 9:
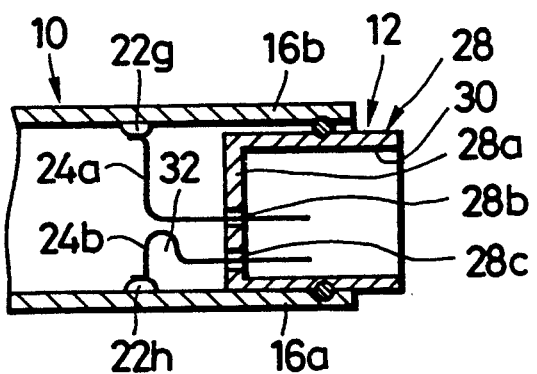
FIG. 9 is a sectional view showing an arrangement of a modification of the integrated circuit of the second embodiment.

As shown in FIG. 9, in the modification of the second embodiment, one set of the connecting terminals 22g are aligned on the upper circuit board 16b, and the other set of the connecting terminals 22h are aligned on the lower circuit board 16a. With this arrangement, in this modification, a connecting operation of the connecting pins 24a and 24b and the corresponding connecting terminals 22g and 22h, i.e., a soldering operation can be facilitated.

In this modification, the upper through holes 28b are formed in substantially the central portion of the upright segment 28a, and the lower through holes 28c are formed in the lower portion of the upright segment 28a. As a result, the length of each connecting pin 24b connected to the other connecting terminal 22h becomes shorter than that of the connecting pin 24a connected to one connecting terminal 22g. As a result, for the same reason as in the modification described above, an arch portion 32 is formed in a middle portion of the connecting pin 24b connected to the other connecting terminal 22h.

In the second embodiment and its modification, the connecting pins 24a and 24b are connected and fixed to the corresponding connecting terminals 22g and 22h by directly soldering them. However, the present invention is not limited to this. For example, these pins and terminals may be connected as shown in FIG. 10 showing another modification of the second embodiment.

Figure 10:
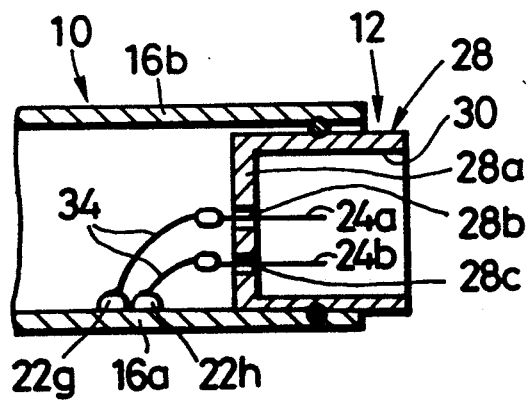
FIG. 10 is a sectional view showing an arrangement of another modification of the integrated circuit of the second embodiment.

As shown in FIG. 10, in another modification of the second embodiment, the connecting pins 24a and 24b are linearly formed, and extend through and are fixed to the through holes 28a and 28b while being vertically stacked and aligned in two arrays in the lateral direction. The connecting pins 24a and 24b and the corresponding connecting terminals 22g and 22h are connected to each other through bonding wires 34. Note that the connecting terminals 22g and 22h are aligned in two, i.e., front and rear arrays on the lower circuit board 16a as in the second embodiment described above.

In the first and second embodiments, the female connector 12 is arranged as a so-called internal mounting type with respect to the case-like IC 10. However, the present invention is not limited to this arrangement, and the female connector 12 may be arranged as shown in FIG. 11 showing the third embodiment.

Figure 11:
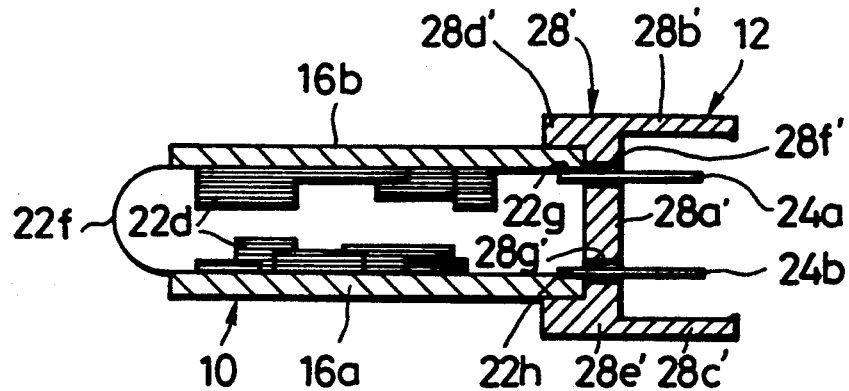
FIG. 11 is a sectional view showing an arrangement of the third embodiment of an integrated circuit according to the present invention.

As shown in FIG. 11, a female connector 12 according to the third embodiment of the present invention is arranged as a so-called external mounting type. More specifically, the female connector 12 is constituted by a connector main body 28' which is formed to have a substantially U-shaped section, and to extend along one edge of an IC 10 to close the one-end opening, and a plurality of pairs of connecting pins 24a and 24b which are aligned in the lateral direction to be vertically separated from each other.

More specifically, the connector main body 28' is formed of an insulating material, e.g., plastic, and to integrally have an upright segment 28a' which is located to close the one-end opening of the case-like IC 10 and through which the connecting pins 24a and 24b extend, a pair of upper and lower connecting segments 28b' and 28c', extending from the upper and lower edges of the upright segment 28a in a direction opposite to the IC 10, for protecting the connecting pins 24a and 24b extending through the upright segment 28a' and for defining a recess 30 for receiving the above-mentioned female connector 14, and a pair of upper and lower mounting segments 28d' and 28e', extending from the upper and lower edges of the upright segment 28a' toward the IC 10 and fixed, such as by adhesive or the like, to the upper and lower side surfaces of one-end portions of a pair of upper and lower circuit boards 16b and 16a of the IC 10 while being in sliding contact therewith.

In the third embodiment, connecting terminals comprise one set of connecting terminals 22g aligned on the upper circuit board 16b and the other set of connecting terminals 22h aligned on the lower circuit board 16b as has been described in one modification of the second embodiment shown in FIG. 9.

A plurality of through holes 28f and 28g' for receiving a plurality of linear connecting pins 24a and 24b are preformed in the upright segment 28a'. The lower and upper ends of a common circuit board 22 are cut off while these connecting pins 24a and 24b are soldered to the connecting terminals 22g and 22h of the common circuit board 22, thus providing the pair of circuit boards 16a and 16b. After the circuit boards 16a and 16b are vertically separated through a flexible circuit board 22f, these connecting pins 24a and 24b are inserted through the through holes 28f and 28g'. In this manner, the connector main body 28' is mounted on the case-like IC 10 in an external mounting state.

According to the arrangement of the third embodiment, the compact and low-cost case-like IC 10 can be realized as in the first and second embodiments.

Figure 12:
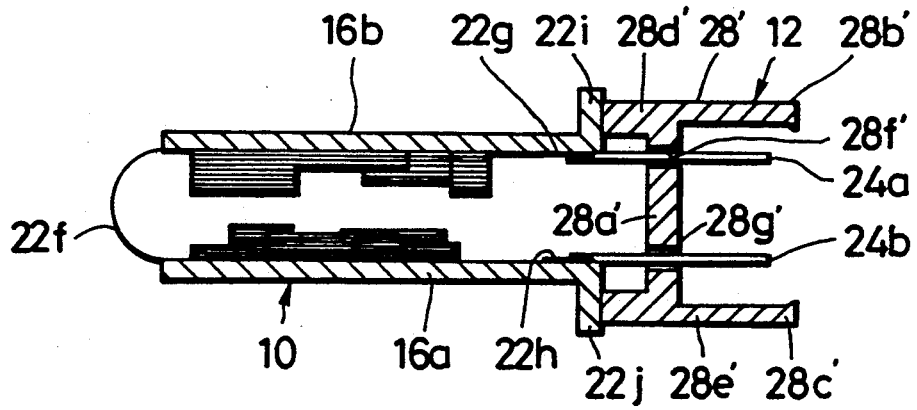
FIG. 12 is a sectional view showing an arrangement of a modification of the integrated circuit of the third embodiment.

In the third embodiment, the lower and upper circuit boards 16a and 16b are mounted on the lower and upper surfaces of the external mounting type female connector 12. However, the female connector may be arranged as shown in FIG. 12 showing one modification of the third embodiment.

In one modification of the third embodiment, the one-end portions of the lower and upper circuit boards 16a and 16b are bent downward and upward, respectively, to integrally have outer flange portions 22i and 22j. The pair of mounting segments 28d' and 28e' of the male connector 12 are fixed, such as by adhesive or the like, to surfaces of the outer flange portions 22i and 22j opposite thereto, so that the female connector 12 is integrally mounted on the case-like IC 10.

When the female connector 12 is mounted on the IC 10 like in this modification, the same effect as in the above-mentioned first embodiment can be provided.

In this modification, the connecting pins 24a and 24b used for the female connector 12 are linearly formed like in the third embodiment. However, the present invention is not limited to this. For example, the connecting pins may be formed as shown in FIG. 13 showing another modification of the third embodiment.

Figure 13:
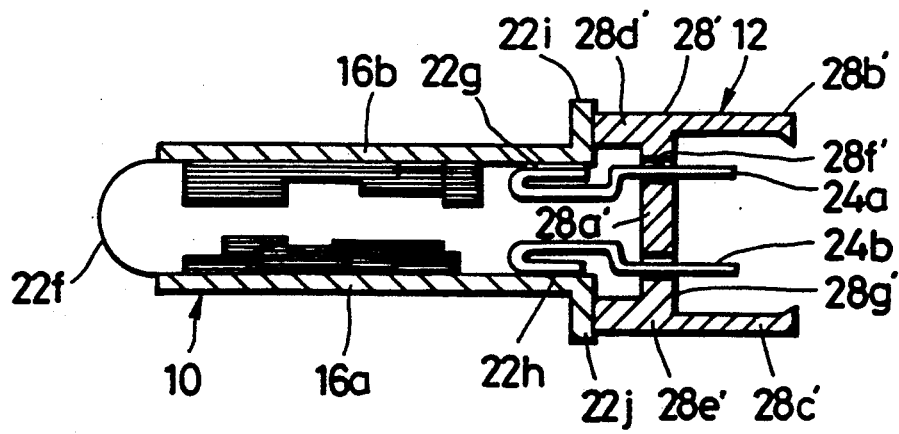
FIG. 13 is a sectional view showing an arrangement of another modification of the integrated circuit of the third embodiment.

As shown in FIG. 13, in another modification, each of the connecting pins 24a and 24b has a stepped portion at its middle portion, and an end portion connected to a corresponding connecting terminal 22g or 22h is folded back at 180°. When this modification is arranged as described above, the following effects can be provided in addition to the effect of the third embodiment.

More specifically, connection with the male connector 14 may often be unsuccessful, and then the connecting pins 24a and 24b abut against the end face of the male connector 14 and are pushed inwardly. When the connecting pins 24a and 24b are pushed inwardly, the connecting pins 24a and 24b are disengaged from the corresponding connecting terminals 22g and 22h since they have the linear shape as described above. However, in this modification, even if such a problem occurs, the connecting pins 24a and 24b are satisfactorily deformed on the basis of the shape of the connecting pins 24a and 24b, and can be prevented from being disengaged from the connecting pins 22g and 22h.

From another point of view, an IC used for a vehicle according to the present invention, in which a conductive foil is adhered on a conductive circuit board through an insulating layer to fix circuit elements, can also be considered as an invention characterized in that one functional component for a vehicle is constituted by independent ICs and the conductive circuit board is formed as a functional component case.

When the present invention is considered as described above, since one functional component for a vehicle is constituted by independent ICs and the conductive circuit board is formed as the functional component case, the entire structure can be rendered light in weight, and an expensive conventional connecting device need not be used, thus reducing cost.

The fourth embodiment will be described below with reference to FIGS. 14 and 15. In the fourth embodiment, the above-mentioned IC is applied to a system (called a total wiring system; to be abbreviated as a TWS hereinafter) which totally connects signal systems used for an antitheft system, a lamp flashing system, an operating system of wipers, and the like in a joint box (connecting box), and connects a control system to the joint box to control the above systems.

Figure 14:
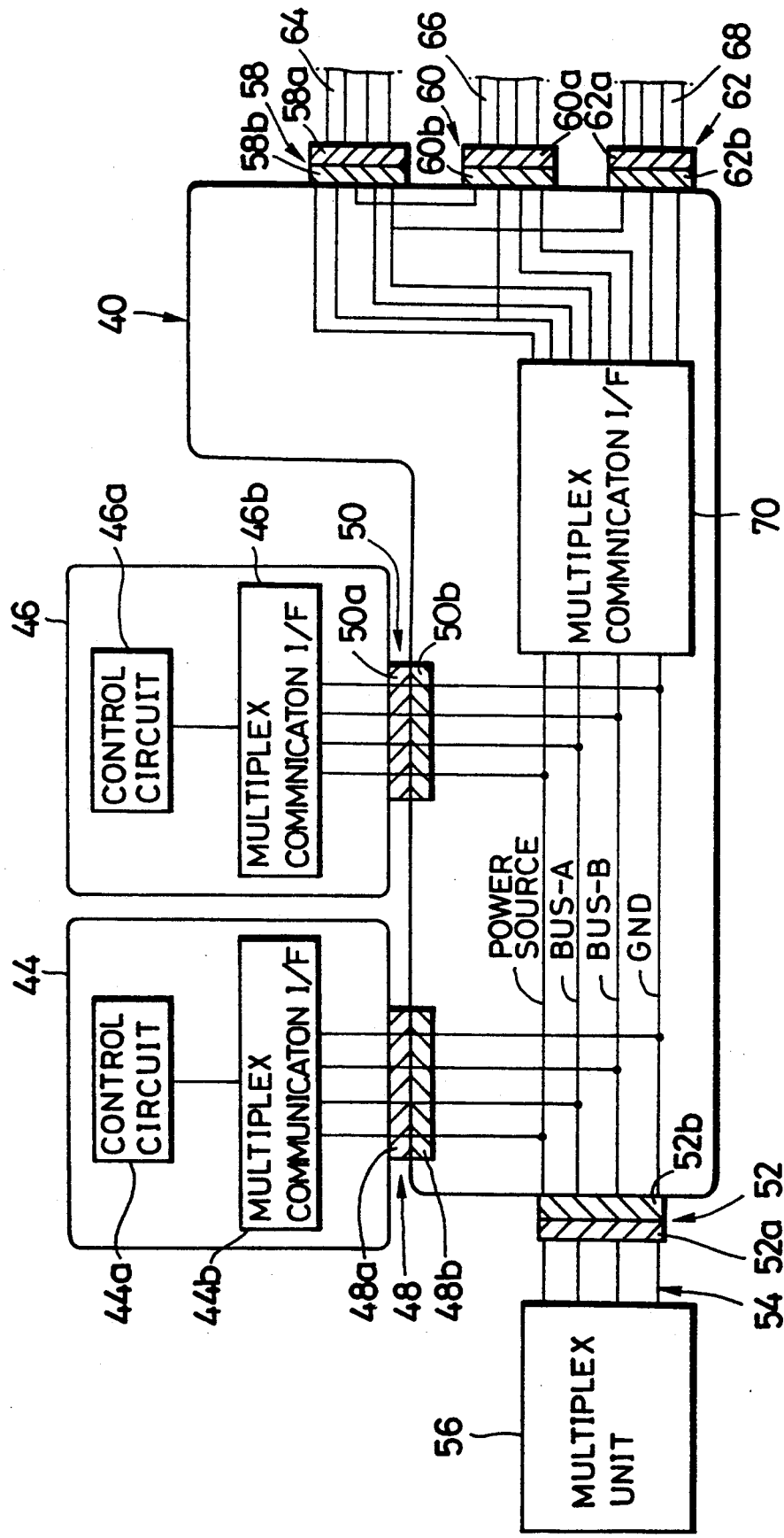
FIG. 14 is a block diagram showing an arrangement of the fourth embodiment in which an integrated circuit according to the present invention is applied to a TWS.

FIG. 14 shows a joint box 40 used in the fourth embodiment. The joint box 40 is detachably connected to a plurality of logic modules, i.e., first and second ICs 44 and 46 in the fourth embodiment through first and second connector mechanisms 48 and 50 while a conventional TWS control unit is divided in units of modules.

The arrangement of each of the ICs 44 and 46 is basically the same as that of the IC 10 described in the first embodiment, and a description thereof will be omitted. However, the ICs 44 and 46 have different control contents in independent functional components for a vehicle. More specifically, the first control circuit (IC) 44 comprises a control circuit 44a for executing a function of an antitheft system constituted as one independent functional component for a vehicle, and a first multiplex communication interface circuit 44b for connecting the control circuit 44a, and an external portion to be controlled and an external detection portion through multiplex transmission. On the other hand, the second control circuit (IC) 46 comprises a control circuit 46a for executing a function of a lamp flashing system as another independent functional component for a vehicle, and a second multiplex communication interface circuit 46b for connecting the control circuit 46a, and an external portion to be controlled and an external detection portion through multiplex transmission.

The first connector mechanism 48 comprises a first female connector 48a integrally formed on the first IC 44, and a first male connector 48b integrally mounted on the joint box 40 to be detachable with the first female connector 48a. The second connector mechanism 50 comprises a second female connector 50a integrally formed on the second IC 46, and a second male connector 50b integrally mounted on the joint box 40 to be detachable with the second male connector 50a.

The first and second connectors 48a and 50a have the same shape as that of the female connector 12 in the first embodiment. As a result, the first and second male connectors 48b and 50b have the same shapes as that of the male connector 14; in the first embodiment. The first female connector 48a integrally mounted on the first IC 44 can be connected to the second male connector 50b, while the second female connector 50a integrally mounted on the second IC 46 can be connected to the first male connector 48b.

A multiplex unit 56 is connected to the joint box 40 by a multiplex harness 54 through a third connector mechanism 52. The third connector mechanism 52 comprises a third female connector 52a to which a one-end portion of the multiplex harness 54 is connected, and a third male connector 52b integrally mounted on the joint box 40 to be detachable with the female connector 52a.

The first through third connector mechanisms 48, 50, and 52 are connected to transmit multiplexed signals, as will be described later. Connecting terminals of each connector mechanism are formed to include four poles, i.e., terminals for a power supply, one bus line, the other bus line, and ground.

The joint box 40 is also connected to lamps and a horn as portions to be controlled by the first and second ICs 44 and 46, various sensors as detection portions, a battery as a power source, and the like through fourth through sixth connector mechanisms 58, 60, and 62. The fourth through sixth connector mechanisms 58, 60, and 62 respectively comprise female connectors 58a, 60a, and 62a to which one-end portions of harnesses 64, 66, and 68 connected to corresponding portions are connected, and male connectors 58b, 60b, and 62b integrally formed on the joint box 40 to be detachable with these female connectors 58a, 60a, and 62a.

The fourth through sixth connector mechanisms 58, 60, and 62 are arranged to connect non-multiplexed signals, and the number of connecting terminals of these mechanisms is independently determined in accordance with the number of devices to be connected and the like.

A multiplex interface circuit 70 for converting multiplexed data into non-multiplexed data and vice versa is arranged in the joint box 40 to which the various connector mechanisms are connected. The multiplex interface circuit 70 comprises a multiplex terminal group for inputting/outputting multiplexed data, and a non-multiplex terminal group for inputting/outputting non-multiplexed data.

The multiplex terminal group includes four poles, i.e., terminals for a power supply, one bus line, the other bus line, and ground, as described above, and is independently connected to corresponding terminals of the first through third male connectors 48b, 50b, and 52b. That is, the multiplex interface circuit 70 and each of the first through third male connectors 48b, 50b, and 52b are connected through four connecting lines. The non-multiplex terminal group is connected to corresponding terminals of the fourth through sixth male connectors 58b, 60b, and 62b through a plurality of connecting lines.

Figure 15:
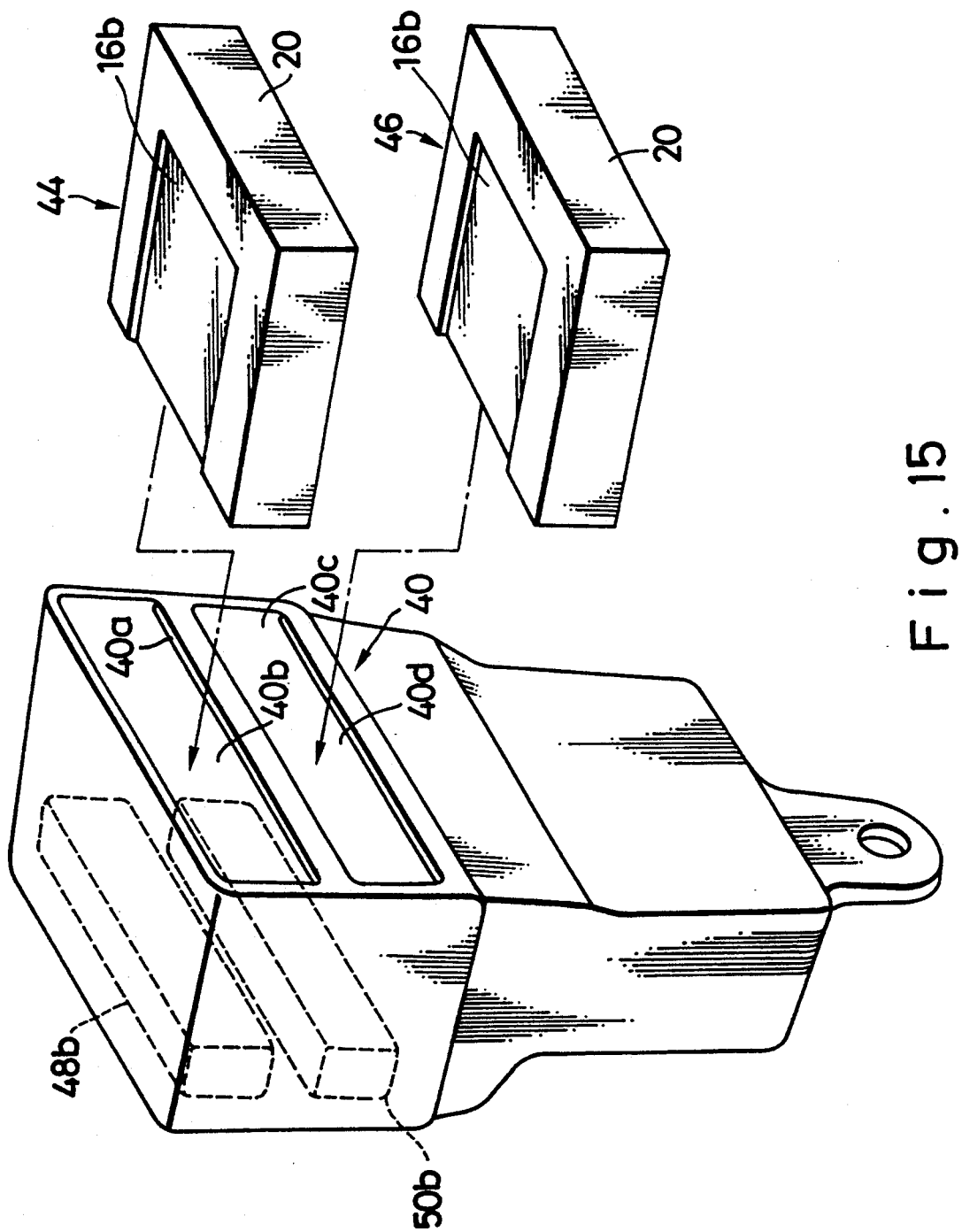
FIG. 15 is a perspective view showing in detail a state wherein two types of integrated circuits in the TWS shown in FIG. 14 are connected to a joint box.

The first and second ICs 44 and 46 are connected to the joint box 40 of the fourth embodiment with the above arrangement, as shown in FIG. 15.

In the fourth embodiment, since a conventional female connector is heavy in weight and large in size, it is not employed, and the exclusive female connectors 48a and 50a are formed in correspondence with the compact and lightweight case-like IC 44. Therefore, the fourth embodiment can contribute to a compact structure of the joint box 40 based on the compact and lightweight ICs 44 and 46.

As described above, in the fourth embodiment, each of the ICs 44 and 46 constituting the logic modules is arranged to have the metal circuit board body 22a. The compact and lightweight ICs 44 and 46 can realize the compact joint box 40 connected thereto.

In the first through fourth embodiments, the connector housing (main body) 28 is formed of an integral member. However, the present invention is not limited to this arrangement but may be arranged, as shown in FIGS. 16 through 19 showing the fifth embodiment.

Figure 16:
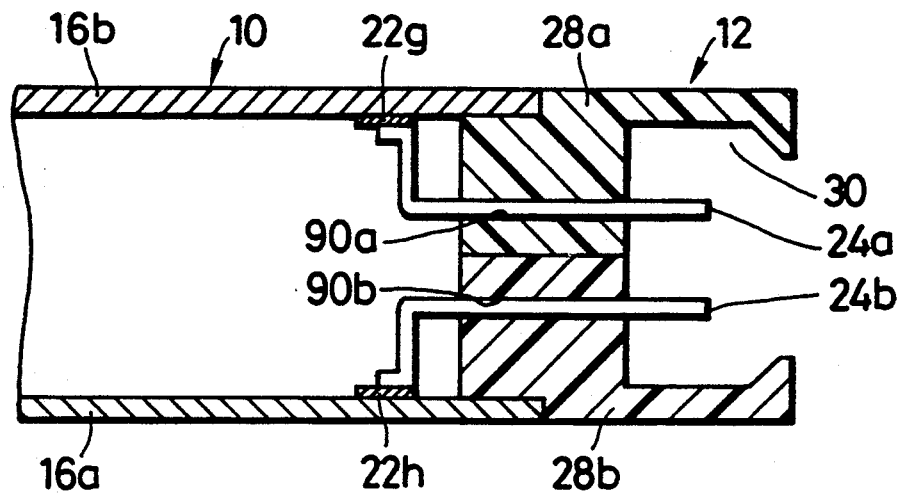
FIG. 16 is a sectional view showing an arrangement of a male connector adopted in an arrangement of the fifth embodiment of an integrated circuit according to the present invention.

More specifically, a female connector 12 of the fifth embodiment comprises a connector housing 28 formed into a box-like housing with one open side surface, as shown in FIG. 16. The connector housing 28 is just fitted in the one-end opening portion of a case-like IC 10 as in the above embodiments.

The connector housing 28 is constituted by vertically coupling two split, i.e., upper and lower connector housing halves 28a and 28b. More specifically, the upper connector housing half 28a is fixed to the lower surface of a one-end portion of an upper circuit board 16b by screws (not shown), and the lower connector housing half 28b is fixed to the upper surface of a one-end portion of a lower circuit board 16a by screws (not shown).

Figure 17:
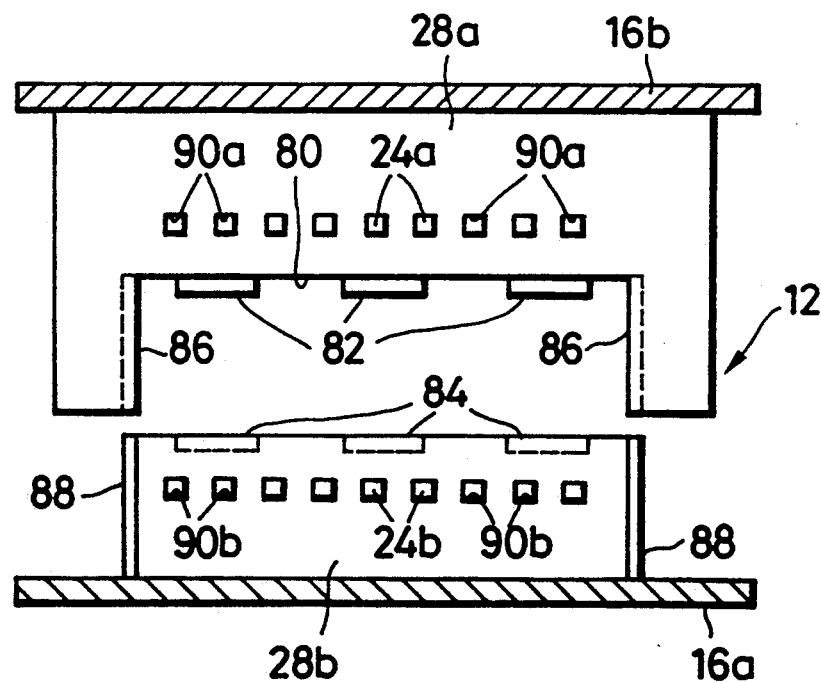
FIG. 17 is a front view showing a state immediately before upper and lower connector housing halves constituting a connector housing shown in FIG. 16 are engaged with each other.

As shown in FIG. 17, the upper connector housing half 28a is formed to have a size larger than the lower connector housing half 28b. A recess 80 for receiving the lower connector housing half 28b from below is formed in the lower surface of the upper connector housing half 28a.

A plurality of downwardly projecting bosses 82 are formed on a surface for defining the upper bottom surface of the recess 80. A plurality of recesses 84 for complementarily receiving these bosses 82 are formed in the upper surface of the lower connector housing half 28b. Upon engagement of these bosses 82 and the recesses 84, a state wherein the upper and lower connector housing halves 28a and 28b are engaged with each other, i.e., a state wherein one connector housing 28 is formed can be precisely defined.

Vertical guide grooves 86 are formed in the two side surfaces of the recess 80. Ridges 88 which are complementarily fitted in the guide grooves 86 are formed on two side surfaces of the lower connector housing half 28b. Upon engagement of these guide grooves 86 and the ridges 88, a relative position between the connector housing halves 28a and 28b when they are assembled to each other can be defined. These halves can be precisely guided to an engagement position defined by the bosses 82 and the recesses 84. After assembly, parallelness between the two circuit boards 16a and 16b can be accurately defined.

Mounting holes 90a and 90b for receiving connecting pins 24a and 24b to extend therethrough are formed in the upper and lower connector housing halves 28a and 28b, respectively. In the fifth embodiment, prior to assembly of the connector housing halves 28a and 28b, the connecting pins 24a and 24b are mounted in and fixed to the corresponding mounting holes 90a and 90b of the upper and lower connector housing halves 28a and 28b to extend therethrough.

Figure 18:
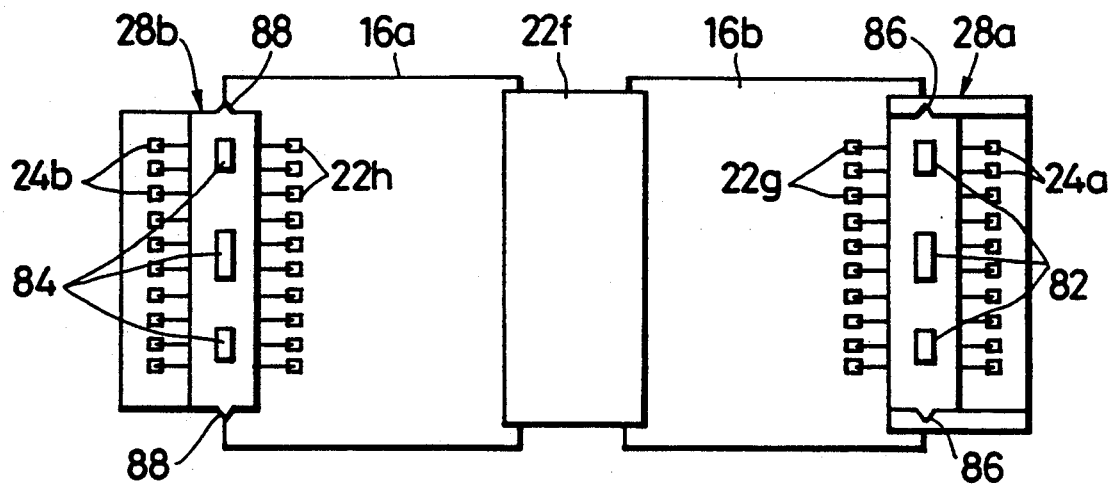
FIG. 18 is a top view showing a state wherein the connector housing halves shown in FIG. 17 are fixed to open circuit boards.

Assembly of the connector housing halves 28a and 28b after the assembly shown in FIG. 16 will be described below with reference to FIGS. 18 and 19.

As has been described above with reference to FIGS. 4A and 4B, upper and lower edges X and Y are cut off from the common circuit board 22 on which predetermined circuit elements 22d are mounted, thus forming the circuit boards 16a and 16b opened on a plane. As shown in FIG. 18, the connector housing halves 28a and 28b are fixed to the open circuit boards 16a and 16b by screws.

As described above, the corresponding connecting pins 24a and 24b have already been mounted on these connector housing halves 28a and 28b. In this manner, the connecting pins 24a and 24b are soldered to corresponding connecting terminals 22g and 22h in an open state of the circuit boards 16a and 16b. In particular, the soldering operation requires a fine operation since there are a large number of connecting terminals 22g and 22h. In the fifth embodiment, since the circuit boards 16a and 16b are opened on an identical plane, the soldering operation can be reliably executed, thus improving workability, and maintaining a good assembly property.

Figure 19:
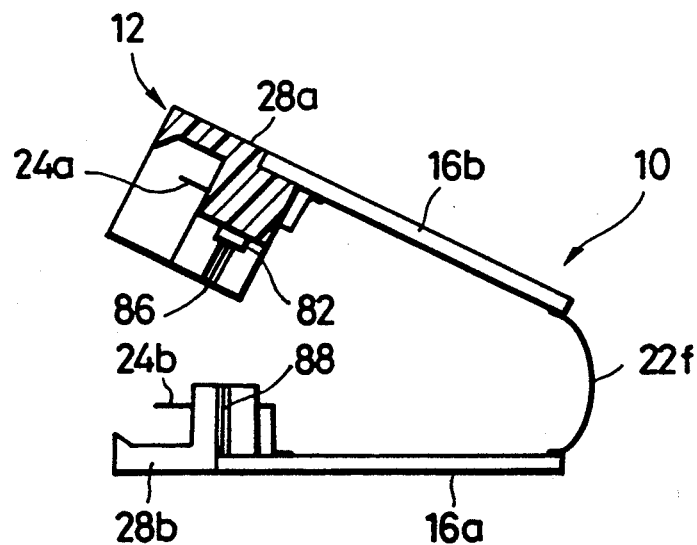
FIG. 19 is a side view showing a state wherein the circuit boards to which the connector housing halves shown in FIG. 17 are fixed are being assembled to each other.

Thereafter, as shown in FIG. 19, the circuit board 16a which is to be located at a lower position is held in position, and the circuit board 16b to be located at an upper position is lifted up and moved to be parallel to the lower circuit board 16a thereabove. As shown in FIG. 17, the ridges 88 are fitted in the guide grooves 86 to be guided along them, and the upper circuit board 16b is then pushed down. In this manner, the lower connector housing half 28b is fitted in the recess 80 of the upper connector housing half 28a. As a result, when the fitting operation is completed, the upper and lower housing halves are integrated upon fitting of the bosses 82 and the recesses 84.

When one connector housing 28 is formed after both the connector housing halves 28a and 28b are integrated, the circuit boards 16a and 16b are set to be parallel to each other. As described above, a side plate 18 is attached, and a frame 20 is fitted, thus forming the IC 10 integrally with the female connector 12, as shown in FIG. 1.

As described above, in the connector structure of the fifth embodiment, the connector housing 28 of the female connector 12 is formed by the two split connector housing halves 28a and 28b. Before the IC 10 is constituted, the connector housing halves 28a and 28b are fixed to the corresponding circuit boards 16a and 16b, respectively, and the connecting pins 24a and 24b are connected to the corresponding connecting terminals 22g and 22h. In this manner, a new effect of maintaining the good assembly property of the IC 10 can be provided.

In the fifth embodiment, the connector housing 28 is split into halves to maintain the good assembly property. However, the present invention is not limited to this arrangement. For example, a female connector 12 may be split into one set of connecting pins 24a and a connector housing 28 to which the other set of connecting pins 24b are mounted in advance, as shown in FIG. 20 showing the sixth embodiment.

The sixth embodiment of the present invention will now be described with reference to FIG. 20.

Figure 20:
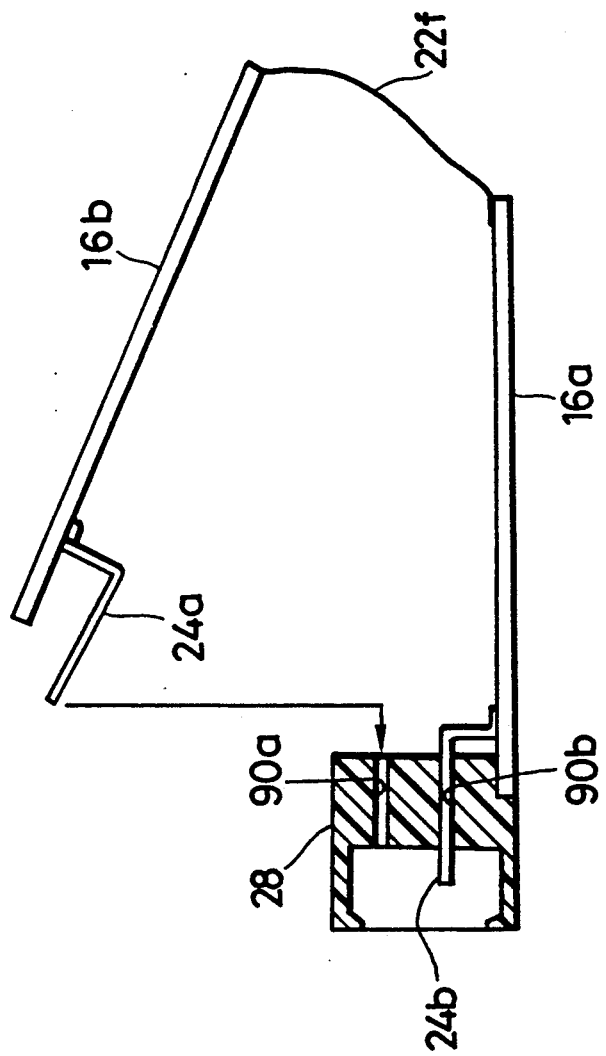
FIG. 20 is a side view showing an arrangement of the sixth embodiment of an integrated circuit according to the present invention.

As shown in FIG. 20, in the connector structure of the sixth embodiment, the female connector 12 comprises an integrally formed connector housing 28 unlike in the fifth embodiment wherein the connector 12 comprises the two split connector housing halves 28a and 28b. The connector housing 28 has the same shape as an integrated shape of the connector housing halves 28a and 28b in the fifth embodiment. Upper and lower mounting holes 90a and 90b for receiving the connecting pins 24a and 24b are formed in the housing 28 to be aligned in two arrays. The connecting pins 24b are mounted in advance in the lower connecting holes 90b of the connector housing 28.

More specifically, in the sixth embodiment shown in FIG. 20, the female connector 12 is split into two sections, i.e., one set of connecting pins 24a and the connector housing 28 to which the other set of the connecting pins 24b are mounted in advance.

Upon assembly of the IC 10 while assembling the female connector 12 to the IC 10, two circuit boards 16a and 16b are formed in an open state on a plane like in the fifth embodiment. One set of connecting pins 24a are connected to connecting terminals 22h of the circuit board 16b to be located at an upper position. The connector housing 28 to which the other set of connecting pins 24b are mounted in advance is fixed to the circuit board 16a to be located at a lower position, and the other set of connecting pins 24b are connected to connecting terminals 22g of the circuit board 16a.

Thereafter, like in the fifth embodiment, one circuit board 16a is held in position, and the other circuit board 16b is lifted up and moved to be parallel to the lower circuit board 16a thereabove. One set of connecting pins 24a connected to the other circuit board 16b are inserted in and fixed to the mounting holes 90a formed in the connector housing 28 fixed to one circuit board 16a.

In a state wherein the arrays of the connecting pins 24a and 24b are mounted on the connector housing 28, the connector housing 28 and the upper circuit board 16a are fixed to each other.

In this manner, when the connector housing 28 is fixed to the circuit boards 16a and 16b, the circuit boards 16a and 16b are set to be parallel to each other. In the same manner as in the fifth embodiment, a side plate 18 is attached, and a frame 20 is fitted like in the fifth embodiment, thus forming the IC 10 integrally with the female connector 12 shown in FIG. 1.

As described above, in the connector structure of the sixth embodiment, the connector housing 28 of the female connector 12 is formed with the other set of connecting pins 24b mounted in advance, and one set of connecting pins 24a are mounted to be connected to the connecting terminals 22h of the other circuit board 16b. Before the IC 10 is assembled, after one set of connecting pins 24a are mounted on the connector housing 28, the other circuit board 16b is fixed to the connector housing.

In the sixth embodiment, a good assembly property of the IC 10 can be maintained.

As many apparently widely different embodiments of the present invention can be made without departing from the spirit and scope thereof, it is to be understood that the invention is not limited to the specific embodiments thereof except as defined in the appended claims.

What is claimed is:

1. An integrated circuit for a vehicle, which is formed in the shape of a case, the circuit comprising:
    a pair of circuit boards opposed to and parallel with each other, each of said circuit boards including
       a metal plate defining an outer portion of the case; an insulating layer formed on an entire inner surface of said metal plate; a conductive layer formed on said insulating layer in a predetermined circuit pattern; a plurality of circuit elements electrically connected to a predetermined portion of said conductive layer; and
    externally connecting connection means for electrically connecting the circuit board to another connector, wherein said eternally connecting connector means includes
       a connector housing fixed to said pair of circuit boards and having a recess for receiving said another connector and an upright segment for closing an open end of the case with a plurality of through holes being formed through said upright segment; and
       a plurality of connector pins, one-end portions of which are connected to connecting terminals formed at an edge portion of said conductive layer, middle portions of which extend through the through holes formed through the upright segment of said connector housing, and the outer-end portions of which project into said recess and contactable with said another connector, and
    wherein said connector housing includes
    first and second connector housing halves respectively fixed to said pair of circuit boards before said pair of circuit boards are assembled to oppose each other, and having a plurality of connector pins connected to the conductive layers of said pair of circuit boards,
    said first connector housing half being substantially U-shaped and having a first pair of engaging portions extending in an engaging direction, said engaging portions being formed on inner side surfaces of said U-shaped first connector housing half and said engaging portion opposing each other,
    said second connector housing half being formed to be fitted into said U-shaped first connector housing half and having a second pair of engaging portions extending in the engaging direction to engage with said first pair of engaging portions,
    whereby said first and second pair of engaging portions serve as slide guides upon assembling said U-shaped first connector housing half with said second connector housing half by sliding in the engaging direction.

2. The integrated circuit according to claim 1, wherein
    said connector housing is of an internal mounting type, which is fixed while being fitted between said pair of circuit boards.

3. The integrated circuit according to claim 2, wherein said recess of said connector housing is open to a side surface at the same side as the side of said circuit board to which said connector housing is fixed, and
    the through holes include a plurality of pairs of upper and lower through holes which are formed along a widthwise direction in a main body portion defining a bottom surface of said recess.

4. The integrated circuit according to claim 3, wherein
    a group of said connecting terminals are aligned in an array along the widthwise direction of each of said pair of circuit boards,
    the connector pins inserted through the upper through holes are electrically connected to connecting terminals aligned on the upper circuit board, and
    the connector pins inserted through the lower through holes are electronically connected to the connecting terminals aligned on the lower circuit board.

5. The integrated circuit according to claim 4, wherein
    the upper through holes are formed at a substantially central portion of said connector housing, and
    each of the connector pins inserted through the lower through holes comprises an arch portion in a portion located between said connector housing and the lower circuit board.

6. The integrated circuit according to claim 3, wherein
    said connecting terminals are aligned in front and rear arrays along the widthwise direction on one circuit board,
    the connector pins inserted through the upper through holes are electrically connected to the rear connecting terminals, and
    the connector pins inserted through the lower through holes are electrically connected to the front connecting terminals.

7. The integrated circuit according to claim 6, wherein
    each of the connector pins inserted through the lower through holes comprises an arch portion in a portion located between said connector housing and said one circuit board.

8. The integrated circuit according to claim 6, wherein
    each of said connector pins is fixed to the corresponding connecting terminal by soldering.

9. The integrated circuit according to claim 6, wherein
    a one-end portion of each of said connector pins is electrically connected to a corresponding connecting terminal through a bonding wire, and a middle portion thereof is fixed in the corresponding through hole.

10. The integrated circuit according to claim 1, wherein said connector housing is of an external mounting type housing which is fixed to outer surfaces of said pair of circuit boards.

11. The integrated circuit according to claim 10, wherein
said connector housing integrally comprises a main body portion for closing an opening end portion of said circuit boards, a pair of mounting portions extending from said main body portion toward the corresponding circuit boards and mounted on the outer surfaces of the corresponding circuit boards, and a pair of connecting portions, extending from said main body portion in directions opposite to the extending directions of said mounting portions, for defining said recess therebetween.

12. The integrated circuit according to claim 1, wherein
said superposition means includes:
at least one projection formed on a contact surface of one connector housing half with respect to the other connector housing half; and
at least one recess, formed on a contact surface of the other connector housing half with respect to one connector housing half, for complementarily receiving said each projection.

13. The integrated circuit according to claim 1, wherein
said first pair of engaging portions respectively comprise an engaging groove extending in the engaging direction formed on the opposing inner side surfaces of said first U-shaped connector housing half, and said second pair of engaging portions respectively comprise a ridge extending in the engaging direction.

14. An integrated circuit for a vehicle, which comprises:
a pair of circuit boards, each of said circuit boards including
a metal circuit board main body; an insulating layer formed on an entire surface of said circuit board main body; a conductive layer formed on said insulating layer in a predetermined circuit pattern; and a plurality of circuit elements electrically connected to a predetermined portion of said conductive layer; and externally connecting connector means electrically connected to another connector, wherein said externally connecting connector means includes
a connector housing of an external mounting type housing which is fixed to outer surfaces of said pair of circuit boards and having a recess for receiving said another connector, a plurality of through holes being formed in said connector housing; and
a plurality of connector pins, one-end portions of which are connected to connecting terminals formed at an edge portion of said conductive layer, middle portions of which extend through the through holes formed in said connector housing, and the other-end portions of which project into said recess are contactable with said another connector, and wherein
each of said pair of circuit boards integrally includes a bent portion which is bent outwardly and fixed to said connector housing, and
said connector housing integrally includes a main body portion for closing an opening end portion of said pair of circuit boards, a pair of mounting portions extending from said main body portion toward the corresponding bent portions and mounted on end faces of the corresponding circuit boards, and a pair of connecting portions, extending from said main body portion in directions opposite to the extending directions of said mounting portions, for defining said recess therebetween.

15. The integrated circuit according to claim 14, wherein
the through holes include a plurality of pairs of upper and lower through holes which are formed along a widthwise direction in said main body portion defining a bottom surface of said recess.

16. The integrated circuit according to claim 15, wherein
a group of said connecting terminals are aligned in an array along the widthwise direction of each of said pair of circuit boards,
the connector pins inserted through the upper through holes are electrically connected to connecting terminals aligned on the upper circuit board, and
the connector pins inserted through the lower through holes are electrically connected to the connecting terminals aligned on the lower circuit board.

17. The integrated circuit according to claim 16, wherein
each of said connector pins has a stepped portion in a middle portion thereof, and is soldered to the corresponding connecting terminal while one-end portion thereof is folded back at 180°.

* * * * *

UNITED STATES PATENT AND TRADEMARK OFFICE
CERTIFICATE OF CORRECTION

PATENT NO. : 5,283,712
DATED : February 1, 1994
INVENTOR(S) : Osamu Michihira, et al.

It is certified that error appears in the above-indentified patent and that said Letters Patent is hereby corrected as shown below:

[57] Abstract, line 1, delete "vehicle,"

line 5, delete after "main body" delete ","

Column 2,   line 15, before holes insert --through--;

line 29, "external" should be --externally connecting--.

Column 4,   line 45, "female" should be --male--.

Column 6,   line 1, "to" (second occurence) should be --of--;

line 45, after "and" insert --since-- line 51, "l" should be --$\ell$--;

line 52, "p" should be --p--;

line 55, "male" (second occurence) should be --female--.

Signed and Sealed this

Twenty-ninth Day of August, 1995

Attest:

BRUCE LEHMAN

*Attesting Officer*         *Commissioner of Patents and Trademarks*